United States Patent
Teplik et al.

(10) Patent No.: US 9,024,324 B2
(45) Date of Patent: May 5, 2015

(54) GAN DUAL FIELD PLATE DEVICE WITH SINGLE FIELD PLATE METAL

(75) Inventors: James A. Teplik, Mesa, AZ (US); Bruce M. Green, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 242 days.

(21) Appl. No.: 13/603,801

(22) Filed: Sep. 5, 2012

(65) Prior Publication Data

US 2014/0061659 A1    Mar. 6, 2014

(51) Int. Cl.
*H01L 29/778* (2006.01)
*H01L 29/40* (2006.01)
*H01L 29/66* (2006.01)
*H01L 29/20* (2006.01)

(52) U.S. Cl.
CPC .......... *H01L 29/402* (2013.01); *H01L 29/7789* (2013.01); *H01L 29/66431* (2013.01); *H01L 29/66462* (2013.01); *H01L 29/7786* (2013.01); *H01L 29/2003* (2013.01)

(58) Field of Classification Search
CPC .................. H01L 29/1075; H01L 2924/1033; H01L 29/402; H01L 21/0254; H01L 29/66431; H01L 29/7789
USPC ........................................................ 257/76
See application file for complete search history.

(56) References Cited

U.S. PATENT DOCUMENTS

| | | | |
|---|---|---|---|
| 8,044,432 B2* | 10/2011 | Chen et al. | 257/192 |
| 8,390,000 B2* | 3/2013 | Chu et al. | 257/76 |
| 8,592,867 B2* | 11/2013 | Wu et al. | 257/194 |
| 8,946,724 B1* | 2/2015 | Shinohara et al. | 257/76 |
| 2005/0145851 A1* | 7/2005 | Johnson et al. | 257/76 |
| 2005/0253168 A1 | 11/2005 | Wu et al. | |
| 2007/0138515 A1 | 6/2007 | Winslow | |
| 2009/0230429 A1 | 9/2009 | Miyamoto et al. | |
| 2011/0169054 A1* | 7/2011 | Wu et al. | 257/194 |
| 2012/0175777 A1 | 7/2012 | Hill et al. | |
| 2013/0099284 A1* | 4/2013 | Tserng et al. | 257/194 |
| 2013/0134512 A1* | 5/2013 | Cheng et al. | 257/339 |
| 2013/0277680 A1 | 10/2013 | Green et al. | |

OTHER PUBLICATIONS

J.G. Lee et al., High Breakdown Voltage (1590 V) AlGaN/GaN-on-Si HFETs with Optimized Dual Field Plates, Date.
S. Sriram et al, High-Gain SiC MESFETs Using Source-Connected Field Plates, IEEE Electron Device Letters, vol. 30, No. 9, Sep. 2009.
R, Chu et al., 1200-V Normally Off GaN-on-Si Field-Effect Transistors With Low Dynamic On-Resistance, IEEE Electron Device Letters, vol. 32, No. 5, May 2011.
S. Kolluri et al., N-Polar AlGaN/GaN MIS-HEMTs on SiC with a 16.7 W/mm Power Density at 10 GHz Using an Ah03 Based Etch Stop Technology for the Gate Recess, 2011 69th Annual Device Research Conference (DRC), Jun. 20-22 2011, pp. 215-216.
H. Xing et al., High Breakdown Voltage AlGaN—GaN HEMTs Achieved by Multiple Field Plates, IEEE Electron Device Letters, vol. 25, No. 4, Apr. 2004.

* cited by examiner

*Primary Examiner* — Evan Pert
(74) *Attorney, Agent, or Firm* — Terrile, Cannatti, Chambers & Holland, LLP; Michael Rocco Cannatti

(57) ABSTRACT

A low leakage current transistor (2) is provided which includes a GaN-containing substrate (11-14) covered by a passivation surface layer (17) in which a T-gate electrode with sidewall extensions (20) is formed and coated with a multi-level passivation layer (30-32) which includes an intermediate etch stop layer (31) which is used to define a continuous multi-region field plate (33) having multiple distances between the bottom surface of the field plate 33 and the semiconductor substrate in the gate-drain region of the transistor.

22 Claims, 6 Drawing Sheets

GAN DUAL FIELD PLATE DEVICE WITH SINGLE FIELD PLATE METAL

BACKGROUND OF THE INVENTION

1. Field of the Invention

The present invention is directed in general to integrated circuit devices and methods for manufacturing same. In one aspect, the present invention relates to the manufacture and use of gallium nitride transistor devices.

2. Description of the Related Art

Semiconductor devices used in high-efficiency power amplifier (HEA) and high power switch applications require high voltage capability, lower device capacitance, and power handling capability. To meet these operating requirements, high power semiconductor devices may be formed with semiconductor materials, such as gallium nitride (GaN), having material properties that are suitable for use in such applications. For example, high speed transistor switch devices, such as high electron mobility transistor (HEMT) devices, formed with GaN-based materials offer many advantages in RF applications, especially in HEA applications, by delivering high current, high breakdown voltage, and high unity gate current cutoff frequency ($f_T$).

BRIEF DESCRIPTION OF THE DRAWINGS

The present invention may be understood, and its numerous objects, features and advantages obtained, when the following detailed description is considered in conjunction with the following drawings, in which.

Figure 1:
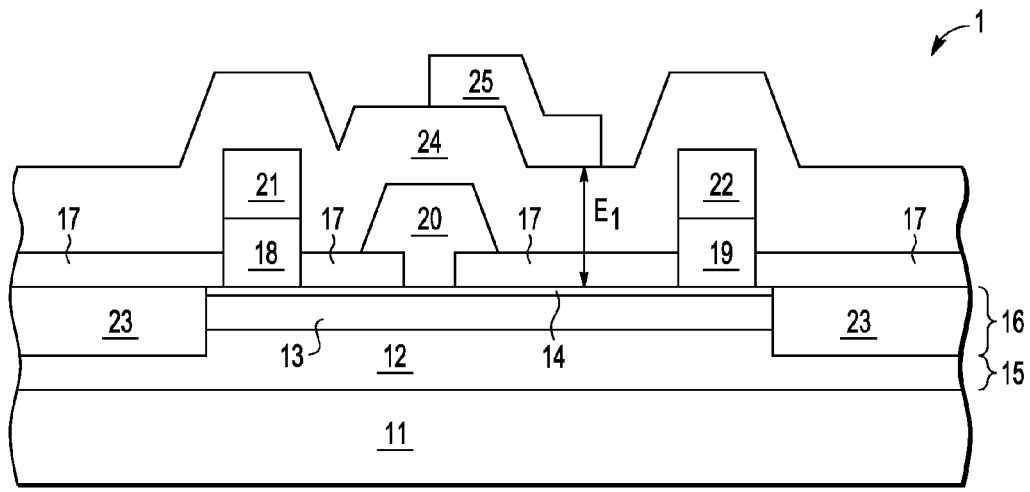
FIG. 1 is a simplified partial cross-sectional view of a field effect transistor with a single field plate for shielding the transistor gate from the transistor drain.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated, among the drawings to represent corresponding or analogous elements.

DETAILED DESCRIPTION

A high frequency, high voltage gallium nitride (GaN) field effect transistor device and associated fabrication process are described for providing a multi-region field plate to reduce dynamic drain to source on-resistance (Rdson) by forming an inter-layer dielectric (ILD) stack with one or more intermediate dielectric etch stop layers which are used to define a multi-region field plate in which a single layer, multi-region field is formed where there are a plurality of distances from the field plate electrode to the device channel. During formation of the multi-layer field plate region, a pattern is etched in the ILD stack which stops at an intermediate dielectric etch stop layer over the gate-drain region while leaving a portion of the ILD stack above the intermediate dielectric etch stop layer, thereby forming a multi-level ILD stack in the gate-drain region. By forming the intermediate dielectric etch stop layer with a material having high selectivity as compared, to an upper dielectric layer in the ILD stack, the intermediate dielectric etch stop layer provides an effective etch stop without comprising the passivation properties of the ILD stack. In the multi-layer field plate region formed in the multi-level ILD stack, one or more layers of conductive material are formed to define a multi-region field, plate which reduces the dynamic Rdson for GaN transistors used in high voltage switching applications. The resulting multi-region field plate simplifies layout requirements and is readily integrated with existing fabrication processes. And by eliminating any gap between separate field plates, the multi-region field plate provides uninterrupted control of the surface and a graded, transition of the electric field. In selected embodiments, drain to source capacitance (Cds) may also be reduced by etching away dielectric between the edge of the multi-region field plate and the drain.

Various illustrative embodiments of the present invention will now be described in detail with reference to the accompanying figures. While various details are set forth in the following description, it will be appreciated, that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described, herein, those skilled in the art will recognize that other materials with similar properties can be substituted without loss of function. It is also noted that, throughout this detailed description, certain materials will be deposited, grown, etched, masked and/or removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

In this disclosure, Applicants have provided an improved high voltage gallium nitride (GaN) field effect transistor device and associated method of fabrication process that address various problems and disadvantages with conventional solutions and technologies. An example of such a disadvantage arises when the operating voltage of the GaN transistor devices is increased by scaling the gate length and increasing the electron concentration in the device channel, which in turn may adversely affect one or more device properties, such as by increasing gate and drain leakage currents, increasing dynamic drain to source on-resistance (Rdson) due to increased fields and trapping phenomenon, and reducing device breakdown voltage. For example, device features and processing steps used to reduce the electronic fields in the transistor area by adding multiple field plates to the transistor structure can add processing costs and complexity without providing sufficient reduction in the electronic field, for high voltage applications.

To illustrate an example GaN hetero-structure transistor device for simultaneously providing high breakdown voltage and high frequency capability, reference is now made to FIG. 1 which depicts a simplified partial cross-sectional view of a hetero-junction field effect transistor (HFET) device 1 with a single field plate for shielding the transistor gate from the transistor drain. As depicted, the HFET device 1 is formed in a semiconductor substrate 11-14 which includes a host or base substrate layer 11 formed with an insulating layer, such as sapphire, Si, SiC, diamond, GaN, AlN and various other generally refractory materials. On the host/base substrate layer 11, a gallium nitride (GaN) buffer layer 12, undoped $Al_xGa_{1-x}N$ barrier layer 13, and an optional thin GaN cap or surface termination layer 14 are sequentially formed using a desired process, such as metal-organic chemical vapor deposition (MOCVD), molecular beam epitaxy (MBE), hydride vapor phase epitaxy (HVPE) or a combination thereof. In an active island or mesa section 16 of the semiconductor substrate 11-14, an active island or mesa 16 is formed to extend from a lower portion 15 of the GaN buffer layer 12, where the electrically inactive insulating material in isolation regions 23 outside the mesa or island. 16 provides device-to-device isolation and the lower portion 16 provides a transition zone for any crystalline imperfections at the interface with the host/base substrate 11. Over the semiconductor substrate, a passivation layer 17 is formed with a dielectric material (e.g., $Si_3N_4$, $SiO_2$, $SiO_xN_y$, AlN, $Al_2O_3$, $HfO_2$, or any combination of the foregoing). The passivation layer 17 is formed with openings for various electrodes 18-20 for the HFET device 1. In particular, the source/drain electrodes 18-19 make contact through openings in the passivation layer 17 to connect source/drain regions (not shown) in the substrate to the conductive interconnections 21-22 for electrical coupling to various other devices or elements (not shown). In addition, the mushroom or T-gate electrode 20 is formed in a gate opening of the passivation layer 17 with a short gate length contact base at the substrate surface with sidewall extensions formed on or over the underlying dielectric passivation layer 17. One or more dielectric layers 24 are formed over the device as a conformal passivation layer in which patterned contact openings are formed (not shown) to expose contacts (e.g., 21, 22). In the contact openings, one or more layers of conductive material are formed to provide the conductive interconnections to other devices or elements (not shown). Unfortunately, the depicted HFET device 1 will have higher gate leakage and poor pulsed current-voltage performance because of high electric fields formed at the drain edge of the mushroom/T-gate electrode. To address this high field effect, a field plate 25 is formed over the gate-drain region, such as by depositing a conductive material over the conformal dielectric layer(s) 24. Formed at a uniform distance from the semiconductor substrate 11-14 in the gate-drain region, the field plate 25 creates a field plate region $E_1$ to shield the transistor gate 20 from the transistor drain region and electrodes 19, 22 and lower the peak electric field between gate and drain and associated gate-drain capacitance, thereby providing improved breakdown voltage, RF stability, and higher gain. However, for high voltage applications, a single field plate region $E_1$ is not sufficient to reduce dynamic drain to source on-resistance (Rdson) and produce adequate breakdown voltage.

Figure 2:
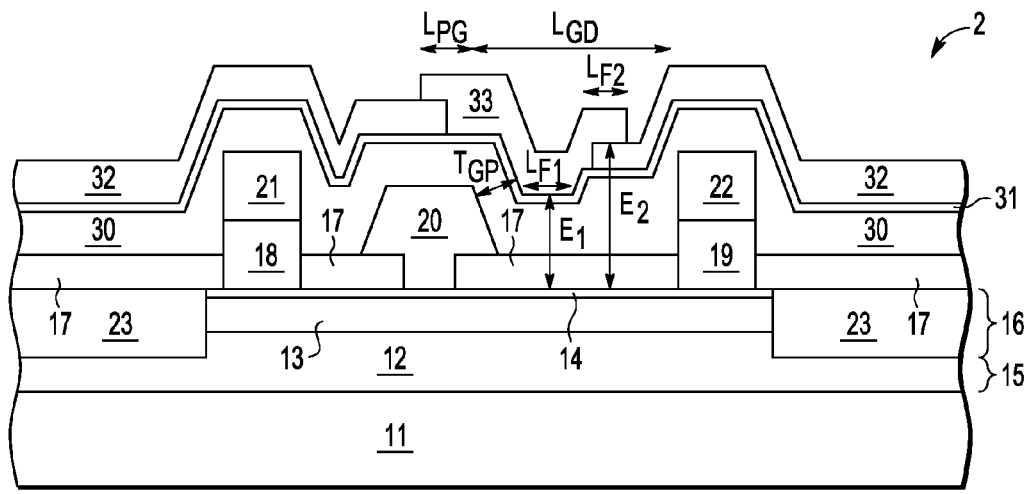
FIG. 2 is a simplified partial cross-sectional view of a field effect transistor with a single layer dual field plate.

To improve dynamic Rdson and improve linear gain over a single region field plate transistor, a single layer, multi-region field plate structure may define multiple distances between the field plate electrode and the semiconductor substrate in regions underneath the field plate with a lower peak electric field intensity than a single region field plate for a GaN transistor. An example is illustrated in FIG. 2 which depicts a simplified, partial cross-sectional view of a hetero-junction field effect transistor (HFET) device 2 with a single layer dual field plate 33. Similar to the HFET device 1 shown in FIG. 1, the HFET device 2 is formed with a semiconductor substrate 11-14 and a passivation surface layer 17 in which source/drain electrodes 18-19 and a gate electrode 20 are formed. Up to this point, the HFET device 2 and associated fabrication sequence is similar to the HFET device 1 shown in FIG. 1. However, a multi-level ILD stack 30-32 is then formed over the HFET device 2 in which is defined a multi-layer field plate 33 formed over the gate-drain region with one or more layers of conductive material. In selected embodiments, the multi-level ILD stack 30-32 is formed by sequentially forming a first dielectric layer 30 (e.g., silicon nitride), a second dielectric layer 31 (e.g., $Al_2O_3$, $HfO_2$, etc.), and a third dielectric layer 32 (e.g., silicon nitride), where the second dielectric layer 31 has high selectivity as compared to an third, dielectric layer 32 so that the second dielectric layer 31 can provide an etch stop layer 31 when etching a multi-layer field plate region in the multi-level ILD stack 30-32. In the multi-layer field, plate region, one or more continuous layers of conductive material are formed to define a multi-region field plate 33 which generates multiple field plate regions $E_1$, $E_2$ from the different heights of the multi-region field plate 33, thereby shielding the transistor gate 20 from the transistor drain structures 19, 22, increasing device breakdown voltage, and reducing dynamic drain to source on-resistance (Rdson). The resulting multi-region field plate 33 has a positioning and shape defined by one or more spacing parameters, including a lateral distance between the plate and gate edge ($L_{PG}$), a lateral distance between the gate edge and drain structure ($L_{GD}$), and/or a uniform thickness measure between the gate sidewall and overlying field plate ($T_{GP}$). The gate overlap parameter $L_{PG}$ may be a function of the alignment tolerance, though in selected embodiments, the multi-region field plate may extend completely over the gate for connection to the transistor source structures 18, 21. In addition, the gate-to-drain spacing parameter $L_{GD}$ is a function of the desired electric field performance from the multi-region field plate 33, and may range from 1-30 um for a high power GaN transistor device, depending on the design of the multi-region field plate 33 which is formed in two different levels of the multi-level ILD stack 30-32 to define at least a first lower field, plate dimension ($L_{F1}$) and a second lower field plate dimension ($L_{F2}$) which are respectively spaced apart from the underlying substrate by a first field plate height associated, with field plate region $E_1$ ($E_1$) and a second field plate height associated with field plate region $E_2$ ($E_2$).

It should be appreciated that the designs and analyses presented, assume that the gate 20 is symmetrical (i.e., gate sidewall extensions on either side of the gate are the same length). Other embodiments may include gates with sidewall extensions of different lengths on the gate and drain sides of the gate (e.g. "gamma gates") that may be used to meet device specifications for certain applications where it is desired to reduce gate-source or gate drain capacitance while increasing the corresponding gate-drain or gate source capacitance, ail the while maintaining low DC gate metal resistance. The principles discussed previously still apply and may be adapted by a device designer with ordinary skill by separately treating the contribution of dielectrics to the gate-source and gate-drain capacitances.

As will be appreciated, a variety of different fabrication processes can be used to manufacture the field, effect transistor devices described herein. For example, FIGS. 3-14 are simplified, cross-sectional views at different stages of manufacture which result in a field effect transistor device that is similar to the HFET device 2 shown in FIG. 2. In these figures, like reference numbers are used to identify like regions in the device.

Figure 3:
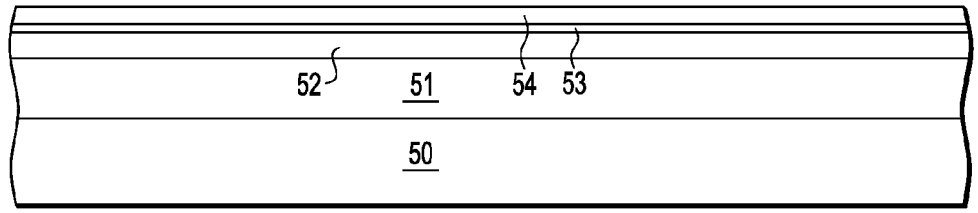
FIGS. 3-14 are partial cross-sectional side views of a gallium nitride transistor at various stages in its manufacture according to selected embodiments of the present disclosure.

An initial manufacturing stage shown in the simplified, partial cross-sectional view in FIG. 3 depicts a wafer structure having a substrate with an epitaxial gallium nitride layer and a passivation surface layer. In an example embodiment, the wafer structure includes a host or base substrate layer 50. Depending on the type of transistor device being fabricated, the substrate layer 50 may be implemented as a bulk semiconductor substrate, an insulator substrate, a bulk metal substrate, a single crystalline silicon (doped or undoped) substrate, a poly-silicon substrate or other polycrystalline semiconductor substrate such as polycrystalline SiC, a semiconductor-on-insulator (SOI) substrate, a single or multi-layered composite film wafer substrate or any material including, for example, Si, SiC, SiGe, SiGeC, Ge, GaAs, InAs, InP, sapphire, diamond, GaN, or AlN, as well as other Group III-IV compound semiconductors or any combination thereof. For high voltage, high frequency applications, the substrate should have at least moderate thermal conductivity ($\kappa$>2 W/cm-K) and have high electrical resistivity ($\rho$>$10^4$ ohm-cm) or semi-insulating ($\rho$>$10^6$ ohm-cm) or even insulating ($\rho$>$10^{12}$ ohm-cm) properties. At the same time, its cost should be appropriate for the application. For these reasons, SiC ($\kappa$=4 W/cm-K, $\rho$=$10^6$-$10^{11}$ ohm-cm) is a preferred choice for high frequency RF applications, while Si ($\kappa$=2 W/cm-K, $\rho$=$10^{-1}$-$10^4$ ohm-cm) is an acceptable choice for lower frequency, cost-sensitive power switch or RF applications, although for certain specific applications other substrates as discussed above may be used.

The wafer structure also includes an epitaxial substrate layer 51 formed (e.g., grown or deposited) on or over the substrate 50 to a predetermined, thickness. The epitaxial substrate layer 51 may be implemented with gallium nitride (GaN) and/or aluminum nitride (AlN), or any alloys such as aluminum gallium nitride (AlGaN), indium gallium nitride (InGaN), aluminum indium gallium nitride (AlInGaN), or silicon carbide (SiC). These materials are semiconductor compounds with strong chemical bonds that produce a wide, direct bandgap that provides a high breakdown field strength. Group III nitrides and their associated heterostructures (such as AlGaN/GaN, InAlN/GaN, InGaN/GaN, etc.) have a number of attractive properties including high electron mobility, high breakdown field strength, high electron sheet density, and others. Accordingly, group-III nitride materials are being widely investigated in many microelectronic applications such as transistors and optoelectronic devices. In selected, embodiments, the substrate layer 51 may be formed with an epitaxial growth process that is seeded from a seed or nucleation layer (not shown) on the substrate 50 so that a single crystal epi substrate layer 51 is formed. In selected embodiments, the epitaxial substrate layer 51 is formed on surface of substrate 50 by, for example, Metal-Organo Chemical Vapor Deposition (MOCVD), Molecular Beam Epitaxy (MBE), or Hydride Vapor Phase Epitaxy (HVPE) with MOCVD being preferred, for GaN. As described herein and understood by those skilled in the art, the process of forming an epitaxial layer may be described as either depositing or growing a layer so that the "growth" and "deposition" terms are used interchangeably in this respect. As formed, the predetermined thickness of the epitaxial substrate layer 51 may be in the range of approximately 0.05 to 20 micrometers, preferably about 0.3 to 2 micrometers, but thicker and thinner layers may also be used.

The wafer structure may also include an additional undoped or doped $Al_XGa_{1-X}N$ barrier layer 52 formed on the epitaxial substrate layer 51 using any desired technique (e.g., MOCVD, MBE, HVPE, or the like) to a predetermined thickness (e.g., approximately 50-400 Å, preferably about 50-250 Å) to form a hetero-junction. In addition, the wafer structure surface may be covered or terminated with GaN cap or surface termination layer 53 formed on the barrier layer 52 using any desired technique (e.g., MOCVD, MBE, HVPE, or the like) to a predetermined thickness (e.g., approximately 5-80 Å).

On the wafer structure, a first passivation layer 54 is formed with any desired insulating or dielectric material, such as $Si_3N_4$ (silicon nitride), $SiO_2$, $SiO_xN_y$, AlN, $Al_2O_3$, and/or other suitable combinations or mixtures thereof. The first passivation layer 54 may be formed, by depositing $Si_3N_4$ on the surface of the GaN cap or surface termination layer 53 by low-pressure chemical vapor deposition (LPCVD), plasma enhanced chemical vapor deposition (PECVD), physical vapor deposition (PVD), atomic layer deposition (ALD), evaporation, sputtering or other well-known techniques. In selected embodiments, the first passivation layer 54 is formed using LPCVD $Si_3N_4$ to a predetermined thicknesses (e.g., in the range of approximately 50 to 4000 Å, and more particularly about 500-1500 Å), though other thicknesses and materials can be used. As will be appreciated, the choice of material for first passivation layer 54 will depend upon the choice of material for underlying substrate layers and may be selected to render the surface of the underlying substrate stable and having appropriate electrical properties (e.g., charged, or neutral without significant surface states) during subsequent processing steps. In selected, embodiments, the formation of the passivation layer 54 will reduce leakage current in the finally formed device by properly preparing the surface of the GaN layer 53 for deposition, and then depositing a silicon nitride film 42 having a low hydrogen content (e.g., <10%) to prevent a leakage current path from forming at the passivation film and underlying substrate.

Figure 4:
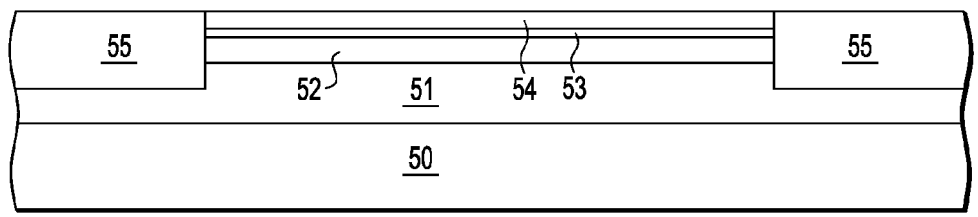

FIG. 4 illustrates processing of the semiconductor structure subsequent to FIG. 3 after isolation regions 55 are formed in the substrate 50-53 prior to ohmic contact formation. Though any suitable technique may be used for form the isolation regions 55, an example approach would be to deposit and pattern an implant mask (not shown) as a layer of photoresist to define and expose the intended isolation regions 55 while covering and protecting the substrate 50-53 and passivation layer 54 in the active region area or "island." Alternatively, the implant mask may be formed by depositing and selectively etching one or more mask layers (e.g., silicon nitride or silicon dioxide) over the first passivation layer 54. Alternatively, the active channel layers 52, 53, and a portion of 51 may be etched away after etching dielectric layers 54 to form a "mesa" (not shown), after which a second LPCVD SiN layer or other suitable dielectric (such as silicon dioxide, $Al_2O_3$, etc.) would be formed to cover the etched regions. However formed, the isolation regions 55 effectively define a mesa or island section for the active regions in the substrate 50-53. In selected embodiments, the isolation regions 55 may be formed, by implanting any desired species of material into the exposed (unmasked) regions of the substrate 50-53 to generate defects (e.g., vacancies) and/or an amorphous crystal structure therein, including but not limited to implanting disruptive species (e.g., nitrogen ions, argon ions, helium ions, oxygen ions, or other inert implant species) at a predetermined implant energy and dopant concentration (e.g., at least approximately $10^{11}$ atoms/cm$^2$) so as to form isolation regions 55 in an upper portion of the exposed, (unmasked) regions of the substrate 50-53 where the implanted ions are incorporated, into the structure of the isolation regions 55. As formed, the isolation regions 55 electrically isolate the active region island, to limit leakage current flow from outside the active region to conducting structures on the device mesa(s) or island(s) (e.g., gate and drain electrodes, contact pads of the source, drain and gate electrodes, and active regions of adjacent device(s) formed, on the same substrate). As will be appreciated, the isolation regions 55 generally have an electrical isolation property with a sheet resistance of in the range of about $10^9$ ohms/□ for implanted isolation regions and in the range of $10^6$ ohms/□ for mesa isolated regions; mesa isolated regions' resistivity is limited by the resistivity of the GaN buffer that remains after mesa etching. When an implant process is used, the isolation regions 55 have a high vacancy concentration (e.g., greater than about $10^{18}$ to $10^{20}$ vacancies/cm$^3$) or crystalline defects which limit, or prevent, the transport office carriers (e.g., electrons or holes) which contribute to the conductivity of the material. When a mesa isolation process is used, the removal of the active device channel leaves only the high resistivity buffer to conduct free carriers in the vicinity of the device. In the embodiments depicted hereafter, implant isolation is preferred, although in some situations, one may choose mesa etching or even a combination of mesa and implant isolation because of device requirements, the type of epitaxial wafer structure used, leakage requirements, equipment availability, cost, and other factors known to one with ordinary skill in the art.

Figure 5:
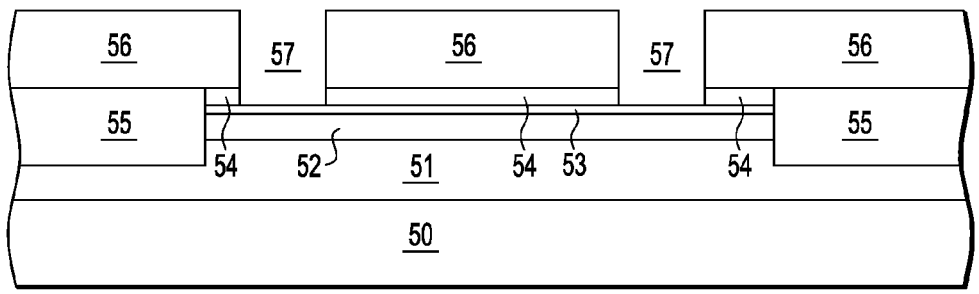

FIG. 5 illustrates processing of the semiconductor structure subsequent to FIG. 4 after source and drain contact openings 57 are formed with a selective etch mask 56 to remove portions of the passivation surface layer 54 and thereby expose the substrate 50-53. As a preliminary step, the isolation implant mask (not shown) is removed or stripped with an appropriate etch chemistry to leave the remnant passivation layer 54. Subsequently, a patterned etch mask 56 is formed, such as by depositing and patterning a layer of photoresist to define and expose openings 57 over the intended source/drain regions while otherwise protecting the substrate 50-53 and passivation layer 54 in the active region area. Depending on the number of type of layers formed in the passivation layer 54, one or more contact etch processes may be applied (such as reactive-ion etching, ion beam etching, plasma etching, laser etching, or the like) to form the source/drain contact openings 57 through the passivation surface layer 54 to expose the substrate surface at the intended, source and drain regions. In selected embodiments, the source and drain contact openings 57 are formed by using a patterned photoresist or etch mask layer as a mask to etch a silicon nitride passivation surface layer 54 with a suitable selective etch chemistry.

Figure 6:
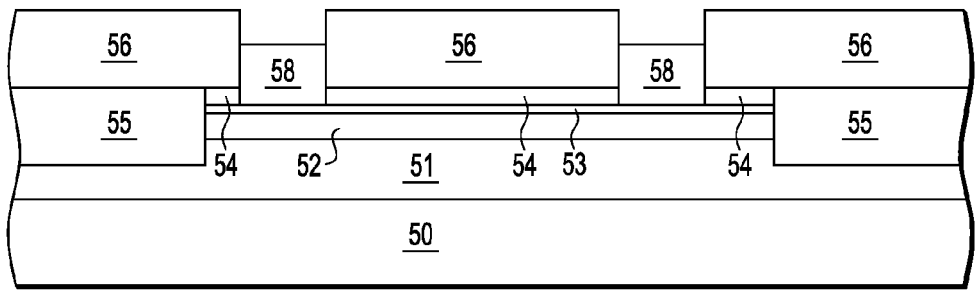
Figure 7:
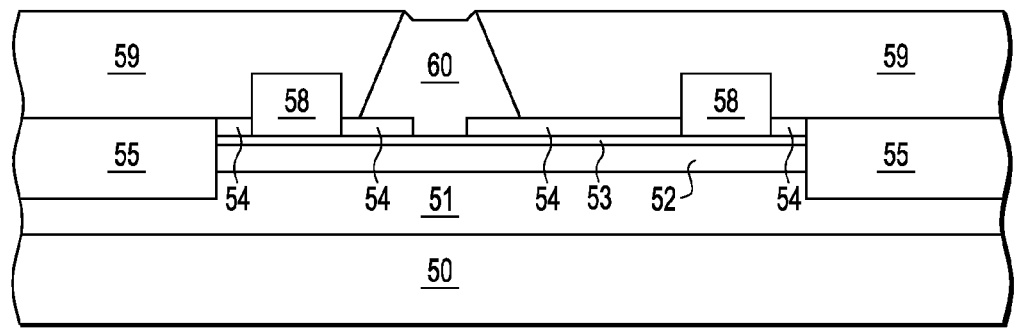

FIG. 6 illustrates processing of the semiconductor structure subsequent to FIG. 5 after one or more source/drain contact layers 58 are formed in contact openings 57. At this stage, the source and drain contacts 58 may be formed with any desired contact formation sequence, including but not limited to using a lift-off process which uses the same patterned photoresist or etch mask layer used to form source and drain contact openings 57. Alternatively, any desired metal deposition and masking and etching sequence may also be used to form the contacts 58 with one or more ohmic metal contact layers. When GaN is used for the surface termination layer 53, the ohmic contacts 58 may be formed as layered TiAlMoAu or TiAlNiAu layers formed by evaporation with the Ti layer in contact with the GaN surface termination layer 53, though other metal combinations and formation procedures can be used. Once formed, the ohmic contacts 58 may be annealed (e.g., at 850 C for 30 sec) as one or more alloy layers to provide ohmic contact to the channel using any desired anneal process, such as a furnace or rapid thermal anneal (RTA), where the anneal can be performed at this step or at any other step in the process preceding the formation of the isolation implant regions. If desired, the implant isolation regions 55 may instead be formed after the ohmic anneal step. As will be appreciated, the formation of ohmic contacts depicted in FIGS. 5-6 is provided for illustration purposes, and the ohmic contacts may instead be formed at a different stage of fabrication, such as prior to the formation of the isolation regions 55 as depicted in FIG. 4.

After forming the source/drain contacts 58, a mushroom or T-shaped gate electrode is formed to contact the substrate 50-53 using any suitable sequence of fabrication steps. For example, a preliminary etch is applied to selectively etch an opening in the surface passivation layer 54 by stripping the etch mask 56, forming a patterned gate etch or photoresist mask (not shown) to define and expose the surface passivation layer 54 over the intended gate electrode contact region, and then applying one or more gate contact etch processes (such as reactive-ion etching, ion beam etching, plasma etching, laser etching, or the like) to form the gate contact opening through the passivation surface layer 54. Once the gate contact surface is exposed, the patterned gate etch/photoresist mask is removed, and the gate contact surface may be annealed at 300-600 C to remove anneal damage from the surface. Also at this stage, one or more gate insulator layers (e.g., silicon dioxide, $Al_2O_3$, $HfO_2$) may be deposited over the gate contact surface and over surface passivation layer 54 to form MISFET or MOSFET devices. Following annealing and possible gate dielectric deposition, a lift-off resist mask 59 may be formed in which a gate electrode opening is formed to expose the gate contact surface of the substrate with an opening larger than the gate contact opening etched in the surface passivation layer 54, and then filled with a gate metal to form the gate electrode 60. To illustrate this sequence, reference is now made to FIG. 7 which illustrates processing of the semiconductor structure subsequent to FIG. 6 after a gate electrode opening is developed in a lift-off resist mask 59 to expose portions of the substrate structure at the intended gate electrode contact area. The lift-off resist mask 59 may be formed by patterning an optical or e-beam resist layer to define an opening for gate metal.

After forming the gate electrode opening in the lift-off resist mask 59, one or more gate metal layers are deposited to form the gate electrode 60 in the gate electrode opening. At this stage, the patterned gate electrode 60 may be formed, after depositing one or more gate insulator layer or conductor layers (e.g., oxide, $Al_2O_3$, $HfO_2$ and/or metal layers) on the substrate structure and at the bottom of the gate electrode opening to form either HEMT, MESFET, MISFET or MOSFET devices. In selected embodiments, one or more initial gate Schottky contact layers (e.g., a Ni—Au or Pt—Au multilayer) are formed or deposited in the gate electrode opening to provide a suitable gate contact for an underlying epi GaN substrate layer 53 by depositing approximately 200 to 1000 Angstroms of Ni, Pd, Ir, Re, Cu, or Pt in the gate electrode opening to provide the desired gate contact. In selected embodiments, Ni is preferred. This Schottky metal is surmounted by 100-20,000 Angstroms of Au to provide lower resistance, but other metals (e.g., Al, Cu, etc.), semi-metals, semiconductors and combinations thereof can also be used, to form the gate contact. In addition or in the alternative, additional gate conductor layers, such as polysilicon, may be deposited in the gate openings, patterned and etched to form the final gate electrode 60. In some configurations, Pt, Pd, Ir, Re, or other suitable barrier metal may be used as a diffusion barrier layer between the Ni, Pd, Ir, Re, Cu, or Pt Schottky metal and Au to prevent Au from mixing with the Schottky metal. As will be appreciated, the gate electrode 60 may be formed with any desired gate formation sequence, including but not limited to metal deposition and etching processes or a lift-off process wherein a gate metal (e.g., a metal comprising Ni and Au) is deposited on the mask 59 and in the gate electrode openings so that, when the mask 59 is removed (e.g., by standard resist strip solvent), only the gate electrode 60, remaining passivation layer 54, and contacts 58 remain.

Figure 8:
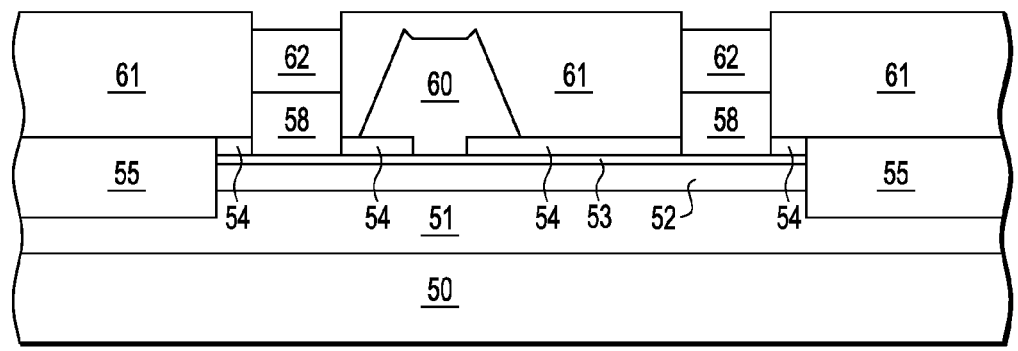

If desired, additional electrodes (such as source/drain electrodes or capacitor plates) can be formed separately. This is illustrated in FIG. 8 which depicts processing of the semiconductor structure subsequent to FIG. 7 after one or more first metal layers 62 are formed in openings of a patterned mask layer 61. As a preliminary step, the lift-off resist mask 59 is removed or stripped, with an appropriate etch chemistry to leave the remnant passivation layer 54, gate electrode 60, and contacts 58. Subsequently, a patterned mask layer 61 may be formed by depositing and patterning a layer of photoresist with patterned openings which expose the source/drain contact layers 58 while covering and protecting the gate electrode 60 and remnant passivation layer 54 in the active region area. The patterned openings in the mask 61 may also expose a capacitor plate area (not shown) over an isolation region. At this stage, the first metal layer(s) 62 may be formed by depositing one or more "metal 1" layers on the patterned mask layer 61 to fill the patterned openings therein. In selected, embodiments, the first metal layer(s) 62 may be formed with any desired metal formation sequence, including but not limited metal deposition and etching processes or a lift-off process wherein a metal is deposited on the mask 61 and its patterned openings so that, when the mask 61 is removed (e.g., by standard, resist strip chemicals), only the gate electrode 60, passivation layer 54, contacts 58, and first metal layer(s) 62 remain. With the first metal layers, the "metal 1" layers may be used to form both the source/drain electrodes 65 and a bottom MIM capacitor plate (not shown).

Figure 9:
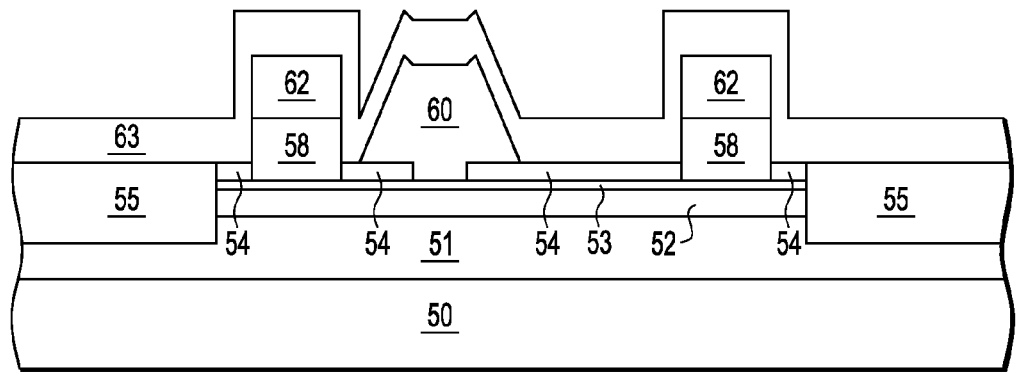

FIG. 9 illustrates processing of the semiconductor structure subsequent to FIG. 8 after one or more first dielectric and/or passivation layers 63 are formed to cover the exposed sidewall surfaces of the gate electrode 60 and source/drain electrodes 58, 62. In an example implementation, the first passivation layers 63 may be formed with any desired insulating or dielectric material (e.g., $Si_3N_4$, $SiO_2$, $SiO_xN_y$, AlN, $Al_2O_3$, and/or other suitable combinations or mixtures thereof) using any desired deposition technique (e.g., conformal CVD, PECVD, PVD, ALD, hot wire-CVD (HWCVD), catalytic CVD (CAT-CVD), electron-cyclotron resonance CVD (ECR-CVD), inductively coupled plasma CVD (ICP-CVD), evaporation, sputtering, etc.) to a predetermined thickness (e.g., approximately 400-20,000 Angstroms) to cover the semiconductor structure. In selected embodiments, an initial passivation layer 63 is formed as an inter-layer dielectric (ILD) with a material having low hydrogen (e.g., <10%) and low ionic or electronic charge content. In these embodiments, the first passivation layers are created by sputtering SiN and SiO2 or a combination of these films over all exposed surfaces of the gate electrode 60 and source/drain electrodes 58, 62. Other embodiments may use SiN deposition by ICP, ECR, PECVD or other techniques that provide low hydrogen films and that have adequate coverage of the sidewalls of gate 60. In other embodiments, the first passivation layer(s) 63 are formed with a highly conformal ALD layer of SiN or $Al_2O_3$ where all exposed surfaces of the gate electrode 60 and source/drain electrodes 58, 62 are coated to a uniform thickness. Of course, it will be appreciated that the first dielectric and/or passivation layer(s) 63 may be formed prior to formation of the first metal layer(s) 62 (shown in FIG. 8), provided that the contacts 58 are appropriately protected or cleared of any passivation layer(s) 63 prior to forming the first metal layer(s) 62. In this case, a second or additional passivation layer could be deposited after forming the first metal layer(s) 62, and then patterned and etched to during formation of the additional second metal layers.

Figure 10:
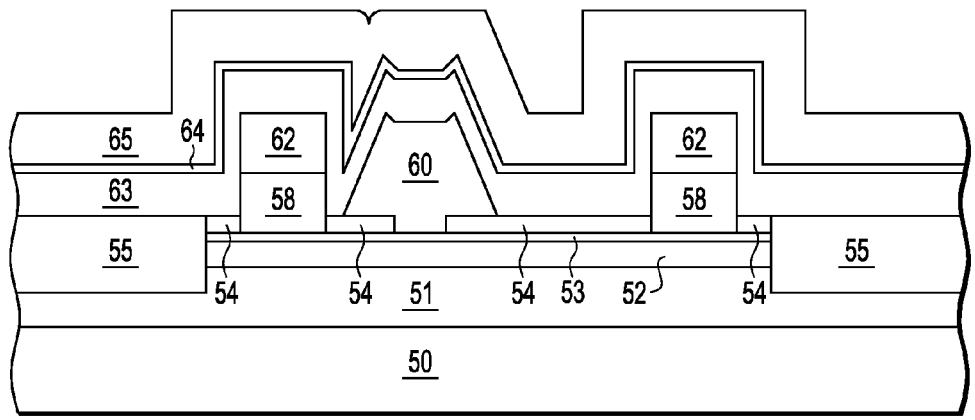

FIG. 10 illustrates processing of a semiconductor structure subsequent to FIG. 9 after an intermediate etch stop dielectric layer 64 and first capping dielectric layer 65 are sequentially disposed, over the first dielectric and/or passivation layers 63. In selected embodiments, the intermediate etch stop dielectric layer 64 is formed by depositing an insulator or high-k dielectric (e.g., a metal-oxide) having different etch selectivity from the first capping dielectric layer 65 using chemical vapor deposition (CVD), plasma-enhanced chemical vapor deposition (PECVD), physical vapor deposition (PVD), atomic layer deposition (ALD), sputtering, evaporation, or any implementation(s) of the above. In an illustrative implementation, the intermediate etch stop dielectric layer 64 is a metal-oxide compound formed by chemical vapor deposition, physical vapor deposition, or by atomic layer deposition having a typical final thickness is in the range of 5-100 nanometers, though other thicknesses may be used. A suitable metal oxide compound for use as the intermediate etch stop dielectric layer 64 is an aluminum-based dielectric (e.g., $Al_2O_3$ or AlN) or a hafnium-based dielectric (e.g., $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $TiO_2$, $Y_2O_3$, $La_2O_3$, $HfSiO_X$, $ZrSiO_X$, $ZrHfOx$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties with suitable etch selectivities, depending on the etch process used.

On the intermediate etch stop dielectric layer 64, the first capping dielectric layer 65 is formed to a predetermined thickness (e.g., approximately 100-20,00 Angstroms) with a dielectric material having a low hydrogen content to limit the amount of hydrogen that migrates to the gate electrode/gallium nitride material interface. In selected embodiments, the first capping dielectric layer 65 is a silicon nitride layer formed by a sputtering process, though other dielectric materials and/or other processes may be used in other embodiments. For example, the first capping layer 65 may be formed with another dielectric material having different etch selectivity from the intermediate etch stop dielectric layer 64, such as silicon nitride, silicon oxynitride, silicon oxide, or silicon dioxide. As formed, the first capping layer 65 may have a low porosity (as indicated, by a low etch rate) to provide high breakdown field strength to help prevent current collapse.

In selected embodiments, the first capping dielectric layer 65 is a silicon nitride layer formed by a sputtering process where the RF power is 2 KW, the pressure is 12 mTorr, the argon flow rate is 57 sccm, and the nitrogen flow rate is 54 sccm. However, different sputtering parameters may be used in other embodiments. In may be desirable that the mass ratio of the amount of nitrogen to argon be at least 0.5 and more preferably, greater than or equal to 0.9. It is believed that providing a sputtering process to form silicon nitride where the nitrogen to argon mass ratio is greater than 0.5 may provide for a lower porosity, lower etch rate, and higher breakdown field strength film. In some embodiments, it is desirable to sputter silicon nitride with the sputtering process being operated in a "poisoned" mode. With a sputtering process in a poisoned mode, a silicon nitride film forms on a silicon target of a sputtering chamber. Particles of the silicon nitride material are then sputtered off of the target and redeposited on the wafer to form the dielectric layer. It is believed that forming a dielectric layer by a sputtering process in such a poisoned mode provides for a stable process that produces a first capping dielectric layer 65 that has a low etch rate.

Figure 11:
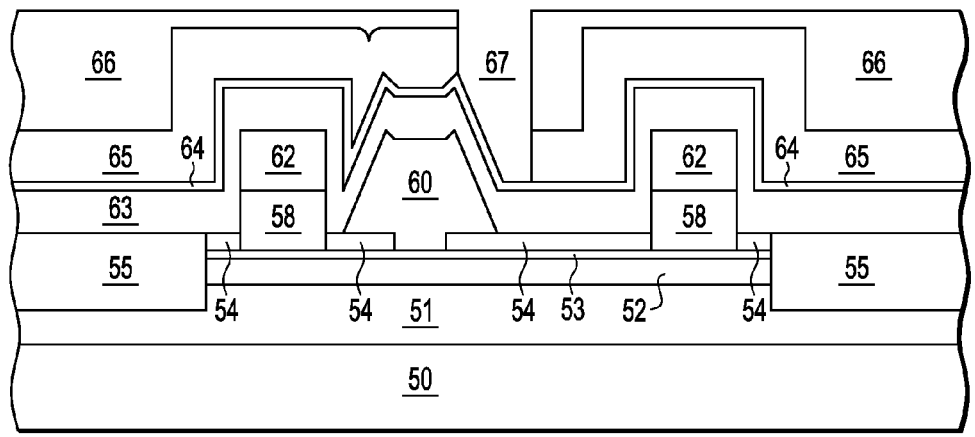

FIG. 11 illustrates processing of a semiconductor structure subsequent to FIG. 10 after a patterned etch mask 66 is formed on the multi-level ILD stack 63-65 to define a field plate opening 67 in the capping dielectric layer 65. In selected embodiments, the patterned etch mask 66 is formed on the first capping dielectric layer 65 of the multi-level ILD stack, such as by applying and patterning a layer of photoresist directly on the first capping dielectric layer 65 to mask the multi-level ILD stack 63-65, or a multi-layer masking technique may be used to sequentially forming a first anti-reflective coating (ARC) layer, a second masking layer (such as a hardmask or TEOS layer) and a photoresist layer which is patterned and trimmed to form a resist pattern 66 over the multi-level ILD stack 63-65.

With the patterned resist or mask layer 66 in place, any exposed portion of the first capping dielectric layer 65 is selectively etched and removed down to the intermediate etch stop dielectric layer 64, thereby leaving the intermediate etch stop dielectric layer 64 and any underlying first dielectric and/or passivation layers 63. The pattern transfer and etching of the mask layer 66 may use one or more etching steps to remove the unprotected portions of the capping dielectric layer(s) 65, including a dry etching process, such as reactive-ion etching, ion beam etching, plasma etching or laser etching, or any combination thereof. For example, any exposed portion of the capping dielectric layer 65 may be removed by using the appropriate etchant processes, such as an anisotropic reactive ion etching (RIE), inductively coupled plasma (ICP) etching, or electron-cyclotron resonance (ECR) etching process using $O_2$, $N_2$, or a fluorine-containing gas. For example, one or more etch processes that are selective for the dielectric materials in the intermediate etch stop dielectric layer 64 (such as a fluorine-based, etch chemistry) are used to etch through to the exposed portion of the silicon nitride first capping dielectric layer 65. As a result of the etch process, the field plate opening 67 is formed in the first capping dielectric layer 65 and down to the intermediate etch stop dielectric layer 64.

Figure 12:
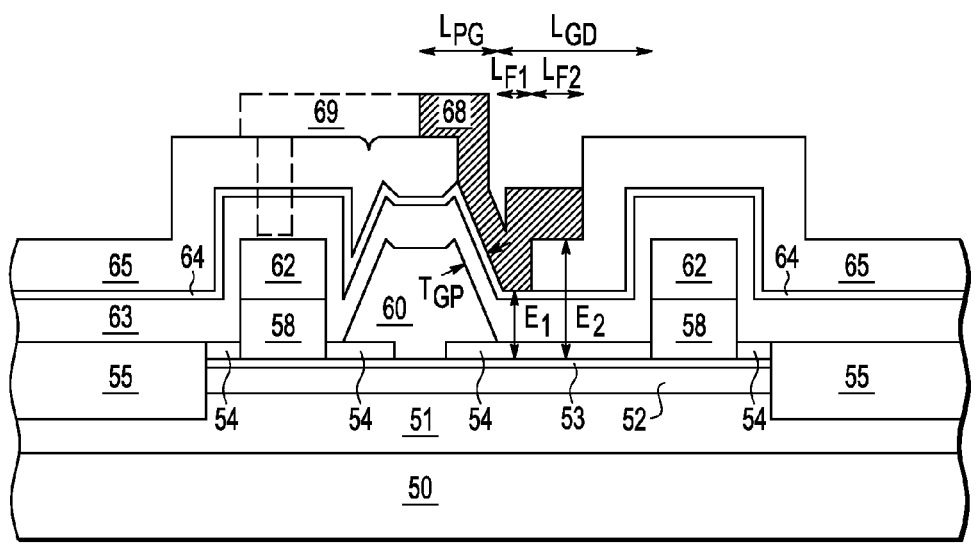
Figure 13:
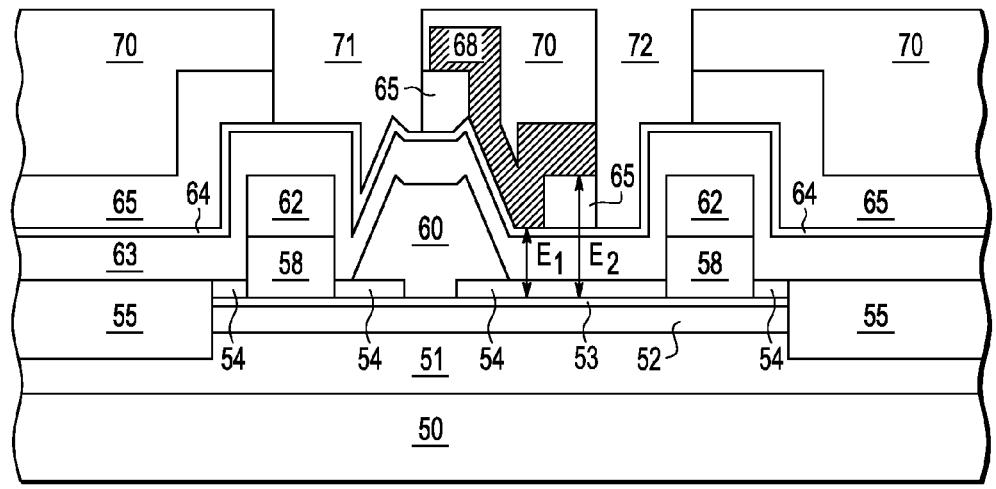

After forming the field plate opening 67, the etch stop layer 64 may be optionally removed using chemistries that etch the etch stop layer 64, but do not attack the underlying first dielectric layer(s) 63. In some embodiments where the etch stop layer 64 comprises $Al_2O_3$ or $HfO_2$ and the first dielectric layer 63 comprises SiN, a buffered, oxide etch (BOE) or $NH_4OH$ or KOH wet-etch chemistry or KOH-based optical lithography developer may be used to etch the etch stop layer 64 while minimally affecting the underlying layer 63. This etch may be accomplished before or after the pattern etch mask 66 is removed. Once the patterned etch mask 66 is removed or stripped, with an appropriate etch chemistry, one or more continuous layers 68 of conductive metal material are formed to cover at least the bottom of the field plate opening 67 and selected portions of the first capping dielectric layer 65 formed, over the gate electrode 60 and the gate-drain region. This is illustrated in FIG. 12 which depicts processing of the semiconductor structure subsequent to FIG. 11 after one or more metal layers are selectively formed to define multi-region field plate 68. Formed, as a continuous layer in contact with the exposed intermediate etch stop dielectric layer 64 (at the first lower field plate dimension $L_{F1}$) and in contact with the unetched first capping dielectric layer 65 (at second lower field plate dimension $L_{F2}$), the resulting multi-region field plate 68 effectively forms a plurality of field plate regions with a single continuous layer, where the first field plate region E1 has a thinner total dielectric thickness than the second field plate region E2. In selected embodiments, the lengths of the field plate regions $L_{F1}$ and $L_{F2}$ should be controlled, to have at least a minimum length corresponding to the alignment tolerance with the gate electrode 60 and field plate opening 67 (e.g., 0.3 um, but can be larger or smaller depending on lithographic capability), with the actual length determined by the desired voltage blocking capability, reduction in gate-drain capacitance (Cgd) and associated added drain source capacitance. Longer total field plate lengths ($L_{F1}+L_{F2}$) tend to increase blocking voltage, reduce Cgd, but increase Cds. In addition, the gate-drain distance, $L_{GD}$, is set to be a sufficient distance from drain contact 58 to provide adequate breakdown, since too small of a value of $L_{GD}$ will cause breakdown between the field plate 68 and the drain contact 58. The first lower field plate dimension $L_{F1}$ may range from 0.3-10 um, and the length of the second lower field plate dimension $L_{F2}$ may range from 0.3-20 um, depending on the desired electric field performance and tolerance alignment, though other lengths may be used. The gate-drain distance in this case will be two to five times the total field plate length $L_{F1}+L_{F2}$ although other values may be used. For example for an $L_{F1}$ value of 1 um and a $L_{F2}$ value of 2 um, the value of $L_{GD}$ may be between 6 and 15 um. At this stage, the multi-region field plate 68 may be formed by depositing one or more metal layers (e.g., on or before "metal 2" metallization) using a patterned mask layer (not shown) to fill the patterned openings therein. In selected, embodiments, the multi-region field plate layer(s) 68 may be formed with any desired metal formation sequence, including but not limited metal deposition and etching processes or a lift-off process wherein a metal is deposited on a patterned mask so that, when the patterned mask is removed (e.g., by standard, resist strip chemicals), only the multi-region field plate 68 remains over at least the first and second field plate regions $L_{F1}$ and $L_{F2}$. As will be appreciated, the multi-region field plate 68 may be electrically connected to other portions of the semiconductor structure, such as the gate electrode 60 (not shown) or to the source electrode structures 58, 62 using one or more conductive layers 69 (indicated with dashed lines).

After formation of the multi-region field, plate 68, selected portions of the multi-level ILD stack 63-65 may be removed, for purposes of reducing parasitic capacitance from the transistor device. While any suitable selective etch process may be used, an example etch sequence is shown beginning in FIG. 13 which illustrates processing of a semiconductor structure subsequent to FIG. 12 after a patterned etch mask 70 is formed on the multi-level ILD stack 63-65 to define openings 71 between the gate and source/drain regions so that at least the exposed capping dielectric layer 65 may be removed. In selected embodiments, the patterned etch mask 70 is formed on the first capping dielectric layer 65 and over the multi-region field plate 68 by applying and patterning a layer of photoresist or a multi-layer masking which is patterned and trimmed to form a resist pattern 70 over the multi-level ILD stack 63-65. With the patterned resist or mask layer 70 in place to mask the multi-region field plate 68 and adjacent sections of the capping dielectric layer 65, any exposed portion of at least the first capping dielectric layer 65 is selectively etched and removed down to the intermediate etch stop dielectric layer 64. The pattern transfer and etching of the mask layer 70 may use one or more etching steps to remove the unprotected portions of the capping dielectric layer(s) 65, including a dry etching process such as reactive-ion etching, ion beam etching, ICP etching, ECR plasma etching, or laser etching, or any combination thereof. For example, an appropriate etchant process, such as fluorine-based etch chemistry, may be used to remove any exposed portion of the capping dielectric layer 65 without etching the intermediate etch stop dielectric layer 64. As a result of the etch process, the field plate opening 67 and adjacent sections of the capping dielectric layer 65 are protected, but the first capping dielectric layer 65 is otherwise removed down to the intermediate etch stop dielectric layer 64.

Figure 14:
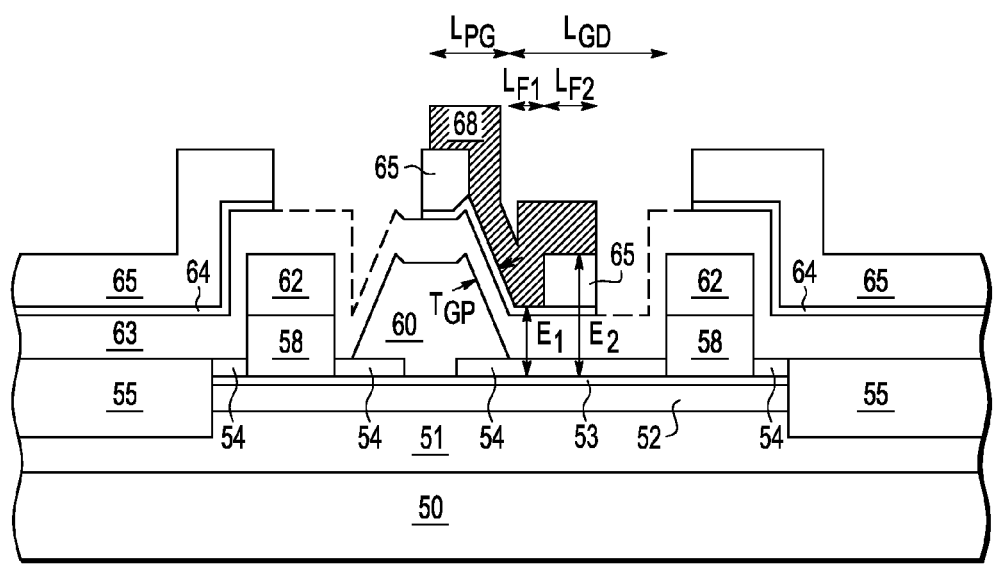

If desired, one or more additional layers from the multi-level ILD stack 63-65 may be removed to further reduce the parasitic capacitance. This is illustrated in FIG. 14 which depicts processing of the semiconductor structure subsequent to FIG. 13 after the patterned etch mask 70 is used to selectively remove at least the intermediate etch stop dielectric layer 64, and possibly also part of the first passivation layer(s) 63 (as indicated with dashed lines). In particular, the patterned resist or mask layer 70 may be used to selectively etch any exposed portion of the intermediate etch stop dielectric layer 64 down to at least the an initial passivation layer 63 while continuing to mask the multi-region field plate 68 and adjacent sections of the capping dielectric layer 65. The pattern transfer and etching of the mask layer 70 may use any desired etching sequence, including a dry etching process (e.g., reactive-ion etching, ion beam etching, plasma etching or laser etching), a wet etching process wherein a chemical etchant is employed, or any combination thereof. For example, an appropriate etchant process that is selective to the underlying first passivation layer(s) 63 may be used to remove any exposed portion of the intermediate etch stop dielectric layer 64. If desired, an additional etch process may be applied to the patterned resist or mask layer 70 to selectively etch part of the exposed initial passivation layer 63, as indicated with dashed line portions of the passivation layer 63. However, a sufficient thickness of the initial passivation layer 63 should be retained to protect the gate and source/drain electrode structures.

After the selectively etching the portions of the multi-level ILD stack outside of the multi-region field plate 68 area, the resulting transistor device has a continuous field plate with multiple distances between the field plate and the semiconductor substrate, depending on how many different layers of the multi-level ILD stack are etched to form the multi-level field plate region. This is illustrated in FIG. 14 which depicts processing of the semiconductor structure subsequent to FIG. 13 after stripping of the patterned, etch mask 71 from the transistor device in which a two-level etch process is used to define the multi-region field plate 68. The resulting multi-region field plate 68 has a positioning and shape defined by one or more spacing parameters, including a lateral distance between the plate and gate edge ($L_{PG}$), a lateral distance between the gate edge and drain structure ($L_{GD}$), and/or a uniform thickness measure between the gate sidewall and overlying field plate ($T_{GP}$). In addition, the multi-region field plate 68 is formed in two different levels of the multi-level ILD stack 63-65 to define at least a first lower field plate dimension ($L_{F1}$) and a second lower field plate dimension ($L_{F2}$) which are respectively spaced apart from the underlying substrate by a first field plate height ($E_1$) and a second field plate height ($E_2$), thereby generating a plurality of field plate regions denoted $E_1$ and $E_2$ with plurality of distances between the field plate metal and the semiconductor substrate. The resulting transistor device provides devices having superior dynamic Rdson, lower gate to drain capacitance (Cgd), lower drain to source capacitance (Cds), and higher breakdown voltage. In addition, by using a single and continuous field plate metal layer to form a multi-region field plate, the disclosed fabrication methodology provides an improved and simplified, layout and integration with continuous control of surface and superior flexibility in electric field control.

To connect the semiconductor structure to other circuitry, additional interconnect layers may be formed to complete the gate, source, and drain electrodes using any desired metallization, masking and etching steps. As will be appreciated, additional conductive or metal layers may be formed in direct ohmic contact with the source/drain metal layers 62 to define separate source and drain conductor paths, such as by using any desired metal formation sequence, including but limited, to contact and via formation in interlayer dielectric layers using damascene processes, lift-off processes, plasma etching, etc.

Figure 15:
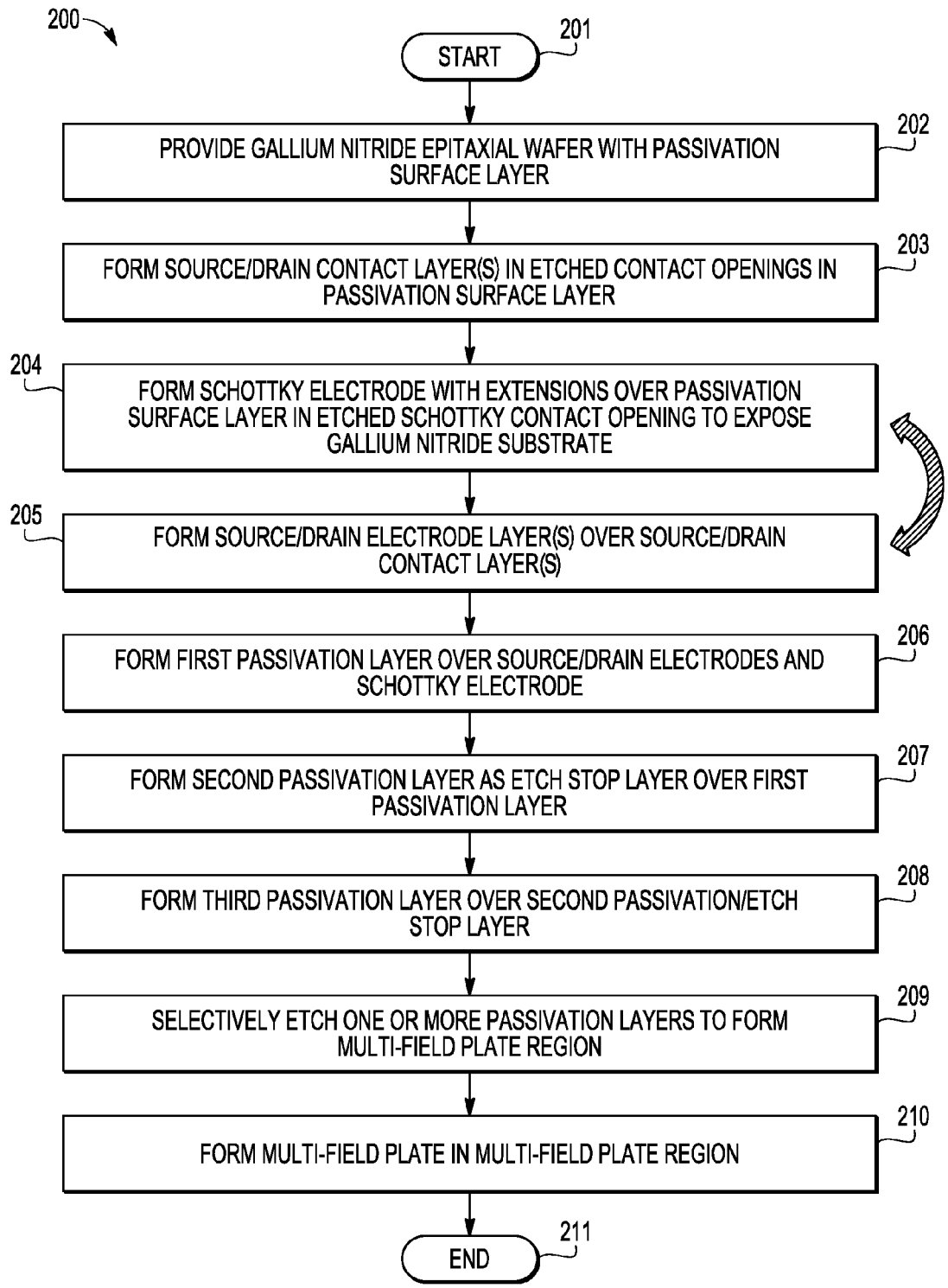
FIG. 15 is a simplified schematic flow chart illustrating various methods for fabricating GaN dual field plate devices in accordance with selected embodiments of the disclosure.

To further illustrated selected embodiments of the present invention, reference is now made to FIG. 15 which is a simplified schematic flow chart illustrating various methods for fabricating GaN multi-region field plate devices in accordance with selected embodiments of the disclosure. In describing the fabrication methodology 200, the description is intended merely to facilitate understanding of various exemplary embodiments and not by way of limitation. Unless otherwise indicated, subsequent steps may be provided in any desired order.

Once the fabrication methodology starts (step 201), a substrate layer is provided at step 202 which includes a gallium nitride epitaxial wafer layer that is covered by a passivation surface layer using means well known in the art. For example, the passivation surface layer may be formed by depositing a thin (e.g., 5-200 nm) layer of LPCVD SiN, though any desired insulating or dielectric material (e.g., $SiO_2$, $SiO_xN_y$, AlN, $Al_2O_3$) and deposition technique (e.g., conformal CVD, PECVD, PVD, ALD, HWCVD, CAT-CVD, ECR-CVD, ICP-CVD, evaporation, sputtering, etc.) could be used. In selected embodiments, the passivation surface layer is formed with a material that is selected to reduce leakage current in the finally formed device by properly preparing the surface of the underlying epi GaN substrate layer for deposition, and then depositing a silicon nitride film having a low hydrogen content (e.g., <10%) to prevent a leakage current path from forming at the passivation surface layer and substrate surface. On the substrate, alignment marks may be formed using Si, Ti—Pt or other suitable material to provide suitable contrast for either optical or e-beam alignment. In addition, isolation regions are implanted using a photoresist implant mask which is subsequently stripped.

At step 203, a first patterned etch mask layer is formed to etch contact openings in the passivation surface layer in which source/drain contact layers are formed. For example, a patterned photoresist mask may be formed with etch contact openings which expose the passivation surface layer in the intended source/drain contact regions, followed by application of an anisotropic silicon nitride etch to remove the exposed regions of the passivation surface layer. Following the ohmic contact etch, ohmic metal is deposited and lifted off. The ohmic metal may then be annealed using a rapid thermal anneal heating step. In selected embodiments, the ohmic contacts may be formed by first applying a patterned etch mask layer to etch expanded contact openings in the passivation surface layer, and then subsequently forming a second patterned etch mask layer having contact openings exposing the substrate within the expanded contact openings in which source/drain contact layers are formed by depositing and lifting off a ohmic metal material.

At step 204, a Schottky gate electrode may be formed. As a preliminary step, a Schottky contact opening is etched in the surface passivation layer. For example, a patterned, resist mask may be formed with etch contact openings which expose the passivation surface layer around, the intended gate electrode region, followed by application of low power $SF_6$ reactive ion etch to remove the passivation surface layer from the exposed regions. After etching, the resist mask is removed. The etched wafer may then optionally be annealed at a temperature between 350 and 500 C in a $N_2$ or $O_2$ environment to remove damage caused by the etch. In the Schottky contact opening, a Schottky gate electrode may be formed by patterning a lift-off resist layer in an area surrounding the etched Schottky contact opening in the passivation surface layer which exposes the gallium nitride substrate layer. In the patterned lift-off resist mask layer, a Schottky gate electrode is formed that includes lateral extensions or wings which may extend, over the underlying passivation surface layer. For example, a multi-layered optical or e-beam resist mask is selectively developed to form a mushroom or T-shaped opening having a base or stem over the Schottky contact opening. Subsequently, the Schottky electrode may be formed with a lift-off process wherein a gate metal (e.g., comprising Ni and Au) is deposited on the multi-layered resist mask and in the Schottky contact opening so that, when the multi-layered resist mask is removed (e.g., by standard resist strip solvent), the Schottky electrode remains.

At step 205, source/drain electrode layers are formed over the source/drain contact layers. This may be implemented by forming a patterned mask layer with etch openings exposing the source/drain contact layers. Subsequently, the source/drain electrode layers may be formed with a lift-off process wherein a first metal layer is deposited, on the patterned mask layer and in the etch openings so that, when the patterned mask layer is removed (e.g., by standard resist strip solvent), the source/drain electrode layers remain. Formation of source-drain electrodes may be optionally combined with the formation of Schottky metal layer in step 204.

At step 206, a first conformal passivation layer is formed over the source/drain electrodes and Schottky electrode so as to coat the exposed sidewall surfaces of the lateral extensions or wings. The first conformal passivation layer may be implemented with any desired non-reactive insulating or dielectric material (e.g., SiN) that is deposited (e.g., by sputtering, evaporation, CAT-CVD, HWCVD, ICP, ECR, or ALD) to a predetermined thicknesses (e.g., 400-2000 Å).

At step 207, a second conformal passivation layer is formed over the first conformal passivation layer to form a uniformly thick passivation layer of etch stop material. The second conformal passivation layer may be implemented with any desired, non-reactive insulating or dielectric material having a predetermined etch selectivity (e.g., $Al_2O_3$) that is deposited (e.g., by conformal ALD) to a predetermined thicknesses (e.g., 50-1000 Å). As formed, the second conformal passivation layer acts as an etch stop during subsequent formation of the multi-region field plate region.

At step 208, a third conformal passivation layer is formed over the second conformal passivation layer to form a uniformly thick passivation layer of low hydrogen content material to limit the amount of hydrogen that migrates to the underlying gate electrode/gallium nitride material interface. In selected, embodiments, the third conformal passivation layer may be implemented with any desired non-reactive insulating or dielectric material having a predetermined etch selectivity (e.g., SiN) that is different from the etch selectivity of the second conformal passivation layer, and may be deposited (e.g., by conformal ALD) to a predetermined thicknesses (e.g., 400-2000 Å). If desired, additional passivation layers having different etch properties may also be formed in sequence to build a multi-level ILD stack.

At step 209, one or more of the passivation layers in the multi-level ILD stack are selectively etched to form a multi-region field plate region. To this end, the region of the multi-level ILD stack between the gate and drain may be patterned and etched with one or more etch masks and designed, etch chemistries to form a multi-level field, plate region, hi selected, embodiments, the selective etch process is applied to use underlying passivation layers as etch stop layers when selectively removing an overlying passivation layer. In other embodiments, timed etch processes or other controlled etch processes are selectively applied to selectively remove one or more of the passivation layers in the multi-level ILD stack, thereby forming the multi-region field plate region. As will be appreciated, steps 207-209 may be repeated one or more times to further define the field plate region, such as by depositing an additional etch stop layer covered by an additional passivation layer over the etched passivation layer(s) and then selectively etching the additional passivation layer down to the additional etch stop layer to define a multi-level opening for the multi-field plate region which includes an opening in the third passivation layer, an adjacent opening in the additional passivation layer, and an adjacent region over the additional passivation layer.

At step 210, a second metal layer is deposited in the multi-region field plate region to form a multi-region field plate. The second metal layer may be formed over the etched passivation layers in the multi-level ILD stack using any desired metal formation process, including but not limited to metal deposition and etching processes or a lift-off process. The transistor is then finished, though additional processing steps may be performed, including depositing a thick layer of sputtered, ICP, or ECR deposited. SiN or other suitable dielectric if additional moisture protection is needed. At step 211, the process ends. As will be appreciated, additional fabrication steps may be performed to fabricate and complete the transistor structures described herein. For example, other circuit features may be formed on the wafer structure, such as transistor devices, using one or more of sacrificial oxide formation, stripping, isolation region formation, well region formation, gate dielectric and electrode formation, extension implant, halo implant, spacer formation, source/drain implant, heat drive or anneal steps, and polishing steps. In addition, backend processing steps (not depicted) may be performed, typically including formation of one or more levels of interconnect vias and conductors in one or more additional passivation layers so as to connect the transistors in a desired manner to achieve the desired functionality. Thus, the specific sequence of steps used to complete the fabrication of the semiconductor structures may vary, depending on the process and/or design requirements.

By now it should be appreciated that there is provided herein a high frequency, high voltage, low leakage current gallium nitride transistor and method for fabricating same. As disclosed, a substrate (e.g., a GaN/AlGaN/GaN substrate) is provided that has a gallium nitride layer covered by a passivation or dielectric surface layer (e.g., $Si_3N_4$). The passivation surface layer is etched using RIE, ECR, or ICP etching to form a gate opening over the substrate. In the passivation layer, a conductive gate electrode is formed with a contact base portion in contact with a gate contact surface of the substrate. In addition, drain and source electrodes are formed to be spaced, apart from the conductive gate electrode and in contact with the substrate. Subsequently, a plurality of passivation or dielectric layers, including a capping dielectric layer formed over a dielectric etch stop layer, are formed over the gate, drain, and source electrodes to provide a passivation stack having a uniform thickness over at least the gate electrode. The passivation layers may be formed with a first passivation layer of silicon nitride that is deposited to a uniform thickness over at least the gate electrode, a dielectric etch stop layer deposited on the first passivation layer using a metal oxide dielectric layer (e.g., conformal $Al_2O_3$ layer), and a capping dielectric layer deposited on the dielectric etch stop layer using a second passivation layer of silicon nitride. In the plurality of passivation layers, a multi-layer plate opening extending from the gate electrode partway toward the drain electrode is formed by selectively etching the capping dielectric layer in a first sub-region overlapping with the gate electrode using the dielectric etch stop layer as an etch stop layer. For example, the multi-layer plate opening may be formed by selectively etching the second passivation layer of silicon nitride in the first sub-region using an etch chemistry that is selective to the metal oxide dielectric layer. In the multi-layer plate opening, a continuous multi-region field plate is selectively formed to shield the gate electrode from the drain electrode. The continuous multi-region field plate may be formed by depositing a conductive layer in at least the multi-region field plate opening, and then selectively etching the conductor layer to form the continuous multi-region field plate in the first sub-region and in a second sub-region over a portion of the capping dielectric layer between the gate electrode and drain electrode. In other embodiments, the continuous multi-region field plate may be formed by forming a patterned resist mask with a patterned opening over the multi-region field plate opening, depositing a conductor layer over the patterned resist mask and in the multi-region field plate opening, and then removing the patterned resist mask to form the continuous multi-region field plate in the first sub-region and in a second sub-region over a portion of the capping dielectric layer between the gate electrode and drain electrode. In this way, the deposited conductor layer forms the continuous multi-region field plate in contact with the dielectric etch stop layer at a first plate region and in contact with the capping dielectric layer at a second plate region, where the first and second plate regions are located at different distances from the substrate. The multi-region field plate may be provided with additional features by forming a second plurality of passivation layers over the multi-region field plate opening and the gate, drain, and source electrodes prior to depositing the conductor layer. In particular, by forming the second, passivation stack with a second capping dielectric layer formed over a second dielectric etch stop layer, the multi-region field plate opening may be formed, by selectively etching the second capping dielectric layer in a third sub-region between the gate electrode and drain electrode using the second dielectric etch stop layer as an etch stop layer, thereby forming a field plate with more than two field plate regions denoted $E_1, E_2 \ldots E_n$. To reduce parasitic capacitance, the passivation stack may be thinned after forming the continuous multi-region field plate by selectively etching the capping dielectric layer in one or more regions adjacent to the continuous multi-region field plate.

In another form, there is provided a field, effect transistor device and associated method of fabricating same. In the disclosed methodology, a first dielectric layer (e.g., a layer that passivates the GaN surface) is formed over a substrate which may include a gallium nitride layer. In addition, conductive Schottky or insulating gate and ohmic drain electrode structures are formed in contact with the substrate after forming first and second openings in the first dielectric layer. Over the conductive gate and drain electrode structures, a plurality of passivation layers are formed to provide a passivation stack having a uniform thickness, where the plurality of passivation layers includes a first capping dielectric layer formed over a first dielectric etch stop layer. In selected embodiments, the first dielectric etch stop layer is formed over the conductive gate and drain electrode structures and first dielectric layer with a metal oxide dielectric layer (e.g., a conformal layer of $Al_2O_3$), and the first capping dielectric layer is formed, using a layer of silicon nitride. The passivation stack may then be selectively etched down to the first dielectric etch stop layer to remove the first capping dielectric layer from a first region which overlaps with the conductive gate electrode structure and extends partway toward the drain electrode structure, thereby forming a first opening in the first capping dielectric layer. In selected embodiments, the field, plate opening is formed by selectively etching the first capping dielectric layer of silicon nitride in the first region between the conductive gate and drain electrode structures using an etch chemistry that is selective to the metal oxide dielectric layer. In the field plate opening and over at least a portion of the first capping dielectric layer, one or more conductive layers are selectively formed to form a continuous field plate that shields the gate electrode from the drain electrode, where the field plate comprises a first region separated from the substrate by a first distance and a second region separated from the substrate by a second, distance. In other embodiments, a second plurality of passivation layers may be formed over the field plate opening and the conductive gate and drain electrode structures prior to depositing one or more conductive layers to provide a second passivation stack having a second capping dielectric layer formed over a second dielectric etch stop layer, followed by selectively etching the second capping dielectric layer in a second region between the gate electrode and dram electrode using the second dielectric etch stop layer as an etch stop layer to form the field plate opening. To reduce parasitic capacitance, the passivation stack may be thinned after forming the continuous field plate by selectively etching the first capping dielectric layer in one or more regions adjacent to the continuous field plate.

In yet another form, there is provided a gallium nitride transistor device and associated method of manufacture. As disclosed, the gallium nitride transistor device includes a substrate having a gallium nitride layer covered by a passivation surface layer with a gate electrode opening formed therein. In the gate electrode opening, a conductive gate electrode is located, to be in contact with the gallium nitride layer. In addition, a passivation stack is formed, over the substrate that includes a first dielectric etch stop layer (e.g., aluminum oxide) formed over the conductive gate electrode and passivation surface layer between the conductive gate and drain electrodes, and a first capping dielectric layer (e.g., silicon nitride) formed over the first dielectric etch stop layer with a first opening formed in the first capping dielectric layer which overlaps with the conductive gate electrode and extends partway to the drain electrode. The gallium nitride transistor device also includes a continuous field, plate formed with a portion in the first opening and over at least part of the first capping dielectric layer, where the field plate includes a first region separated from the substrate by a first distance and a second region separated from the substrate by a second distance. In selected embodiments, the passivation stack may also include a second dielectric etch stop layer formed over the first capping dielectric layer, and a second capping dielectric layer formed over the second dielectric etch stop layer with a second, opening formed in the second capping dielectric layer. In these embodiments, the continuous field plate is formed in the first opening, over at least part of the first capping dielectric layer, in the second opening, and over at least part of the second capping dielectric layer. As a result, the continuous field plate has a first region formed on the first dielectric etch stop layer separated from the substrate by a first distance, a second region formed on the second dielectric etch stop layer separated from the substrate by a second distance, and a third region formed on the second capping dielectric layer separated from the substrate by a third, distance.

Although the described exemplary embodiments disclosed herein are directed to high voltage, high-frequency, low leakage devices with multi-region field plates and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are described with reference to switch devices formed, on GaN-based materials and Si or SiC substrates, this is merely for convenience of explanation and not intended to be limiting and persons of skill in the art will understand that the principles taught herein apply to devices formed with different substrate materials. Accordingly, the identification of particular regions being formed, with one type of material or another is merely by way of illustration and not limitation and other materials may be substituted in order to form devices. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled, in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed, or inherent to such process, method, article, or apparatus.

What is claimed is:

1. A method of forming gallium nitride transistor, comprising:
   providing a substrate with a gallium nitride layer covered by a dielectric surface layer;
   forming a conductive gate electrode with a contact base portion in contact with a gate contact surface of the substrate;
   forming drain and source electrodes spaced apart from the conductive gate electrode and in contact with the substrate;
   forming a plurality of dielectric layers over the gate, drain, and source electrodes, where the plurality of dielectric layers comprises a dielectric etch stop layer and a capping dielectric layer formed over the dielectric etch stop layer;
   forming a multi-region field plate opening extending from the gate electrode partway toward the drain electrode by selectively etching the capping dielectric layer in a first sub-region overlapping with the gate electrode using the dielectric etch stop layer as an etch stop layer; and
   selectively forming a continuous multi-region field plate in the multi-region field plate opening to shield the gate electrode from the drain electrode.

2. The method of claim 1, where the substrate comprises an upper gallium nitride cap layer, a middle aluminum gallium nitride barrier layer, and an underlying gallium nitride buffer layer.

3. The method of claim 1, where selectively forming the continuous multi-region field plate comprises:
   depositing a conductor layer in at least the multi-region field plate opening; and
   selectively etching the conductor layer to form the continuous multi-region field plate in the first sub-region and in a second sub-region over a portion of the capping dielectric layer between the gate electrode and drain electrode.

4. The method of claim 1, where selectively forming the continuous multi-region field plate comprises:
   forming a patterned resist mask with a patterned opening over the multi-region field plate opening;
   depositing a conductor layer over the patterned resist mask and in the multi-region field plate opening; and
   removing the patterned resist mask to form the continuous multi-region field plate in the first sub-region and in a second sub-region over a portion of the capping dielectric layer between the gate electrode and drain electrode.

5. The method of claim 1, where forming the plurality of dielectric layers comprises:
   forming a first dielectric layer of silicon nitride over at least the gate electrode and between the gate electrode and drain electrode;
   forming the dielectric etch stop layer on the first dielectric layer using a metal oxide dielectric layer; and
   forming the capping dielectric layer on the dielectric etch stop layer using a second dielectric layer of silicon nitride.

6. The method of claim 5, where forming the multi-region field plate opening comprises selectively etching the capping dielectric layer of silicon nitride in the first sub-region using a patterned etch mask and an etch chemistry that is selective to the metal oxide dielectric layer.

7. The method of claim 5, where forming the dielectric etch stop layer comprises forming a conformal layer of $Al_2O_3$ on the first dielectric layer.

8. The method of claim 1, where selectively forming the continuous multi-region field plate comprises forming the continuous multi-region field plate in contact with the dielectric etch stop layer at a first plate region and in contact with the capping dielectric layer at a second plate region, where the first and second plate regions are located at different distances from the substrate.

9. The method of claim 8, further comprising selectively etching the capping dielectric layer in one or more regions adjacent to the continuous multi-region field plate.

10. The method of claim 1, further comprising:
    forming a second plurality of dielectric layers over the multi-region field plate opening and the gate, drain, and source electrodes prior to depositing the conductor layer, where the second plurality of dielectric layers comprises a second dielectric etch stop layer formed over the first capping dielectric layer and a second capping dielectric layer formed over the second dielectric etch stop layer; and forming the multi-region field plate opening by selectively etching the second capping dielectric layer in a third sub-region between the gate electrode and drain electrode using the second dielectric etch stop layer as an etch stop layer.

11. A method for forming a transistor comprising:
forming a first dielectric layer over a substrate;
forming conductive gate and drain electrode structures in ohmic contact with the substrate after forming first and second openings in the first dielectric layer;
forming a plurality of passivation layers over the conductive gate and drain electrode structures to provide a passivation stack, where the plurality of passivation layers comprises a first dielectric etch stop layer and a first capping dielectric layer formed over the first dielectric etch stop layer;
selectively etching the passivation stack down to the first dielectric etch stop layer to remove the first capping dielectric layer from a first region which overlaps with the gate electrode structure and extends partway toward the drain electrode structure, thereby forming a first opening in the first capping dielectric layer; and
selectively forming one or more conductive layers in the first opening and over at least a portion of the first capping dielectric layer wherein a continuous field plate is formed from the one or more conductive layers that shields the gate electrode from the drain electrode, where the field plate comprises a first region separated from the substrate by a first distance and a second region separated from the substrate by a second distance.

12. The method of claim 11, where the substrate comprises a gallium nitride layer.

13. The method of claim 12, where forming the first dielectric layer comprises forming a passivation layer of silicon nitride over the substrate.

14. The method of claim 11, where forming plurality of passivation layers comprises:
forming the first dielectric etch stop layer with a metal oxide dielectric layer; and
forming the first capping dielectric layer using a layer of silicon nitride.

15. The method of claim 14, where forming the first dielectric etch stop layer comprises forming a conformal layer of $Al_2O_3$ over the conductive gate and drain electrode structures and first dielectric layer.

16. The method of claim 14, where selectively etching the passivation stack comprises selectively etching the first capping dielectric layer of silicon nitride in the first region between the conductive gate and drain electrode structures using an etch chemistry that is selective to the metal oxide dielectric layer.

17. The method of claim 11, further comprising thinning the passivation stack after forming the continuous field plate by selectively etching the first capping dielectric layer in one or more regions adjacent to the continuous field plate.

18. The method of claim 11, further comprising:
forming a second plurality of passivation layers over the field plate opening and the conductive gate and drain electrode structures prior to depositing one or more conductive layers to provide a second passivation stack comprising a second capping dielectric layer formed over a second dielectric etch stop layer; and
forming the field plate opening by selectively etching the second capping dielectric layer in a second region between the gate electrode and drain electrode using the second dielectric etch stop layer as an etch stop layer.

19. The method of claim 11, where selectively forming one or more conductive layers comprises:
depositing one or more conductor layers in in the first opening and over at least the portion of the first capping dielectric layer; and
selectively etching the one or more conductor layers to form the continuous field plate in the first opening and over at least the portion of the first capping dielectric layer between the conductive gate and drain electrode structures.

20. A gallium nitride transistor device, comprising:
a substrate comprising a gallium nitride layer;
a passivation surface layer covering the gallium nitride layer with a gate electrode opening formed therein;
a conductive gate electrode located in the gate electrode opening to be in contact with the gallium nitride layer;
a passivation stack formed over the substrate comprising a first dielectric etch stop layer formed on the conductive gate electrode and passivation surface layer between the conductive gate and a drain electrode, and a first capping dielectric layer formed over the first dielectric etch stop layer with a first opening formed in the first capping dielectric layer which overlaps with the conductive gate electrode and extends partway toward the drain electrode; and
a continuous field plate comprising a portion in the first opening and over at least part of the first capping dielectric layer comprising a first region separated from the substrate by a first distance and a second region separated from the substrate by a second distance.

21. The gallium nitride transistor device of claim 20, where the first dielectric etch stop layer comprises aluminum oxide, and the first capping dielectric layer comprises silicon nitride.

22. The gallium nitride transistor device of claim 20,
where the passivation stack comprises a second dielectric etch stop layer formed over the first capping dielectric layer and a second capping dielectric layer formed over the second dielectric etch stop layer with a second opening formed in the second capping dielectric layer; and
where the continuous field plate formed in the first opening and over at least part of the first capping dielectric layer is also formed in the second opening and over at least part of the second capping dielectric layer, such that the continuous field plate comprises the first region separated from the substrate by a first distance, the second region separated from the substrate by a second distance, and a third region separated from the substrate by a third distance.

* * * * *